United States Patent [19]
Zimmerman

[11] Patent Number: 6,137,062
[45] Date of Patent: Oct. 24, 2000

[54] BALL GRID ARRAY WITH RECESSED SOLDER BALLS

[75] Inventor: John Zimmerman, Grayslake, Ill.

[73] Assignee: Motorola, Inc., Schaumburg, Ill.

[21] Appl. No.: 09/076,048

[22] Filed: May 11, 1998

[51] Int. Cl.[7] .............................. H05K 1/16; H05R 9/09
[52] U.S. Cl. ......................... 174/260; 174/263; 361/768
[58] Field of Search .................................. 174/262, 263, 174/264, 265, 260; 361/767, 771, 783

[56] References Cited

U.S. PATENT DOCUMENTS

| | | | |
|---|---|---|---|
| 4,807,021 | 2/1989 | Okumura | 257/777 |
| 5,216,278 | 6/1993 | Lin et al. | 257/688 |
| 5,220,200 | 6/1993 | Blanton | 257/778 |
| 5,233,504 | 8/1993 | Melton et al. | 361/760 |
| 5,250,848 | 10/1993 | Christie et al. | 257/778 |
| 5,504,277 | 4/1996 | Danner | 174/261 |
| 5,598,036 | 1/1997 | Ho | 257/738 |
| 5,714,801 | 2/1998 | Yano et al. | 257/691 |
| 5,717,245 | 2/1998 | Pedder | 257/691 |
| 5,726,493 | 3/1998 | Yamashita et al. | 257/698 |
| 5,740,606 | 4/1998 | Rose | 29/840 |
| 6,011,694 | 1/2000 | Hirakawa | 361/774 |

*Primary Examiner*—Jayprakash N. Gandhi
*Assistant Examiner*—Kamand Cuneo
*Attorney, Agent, or Firm*—Gary J. Cuningham; William E. Koch

[57] ABSTRACT

A ball grid array for a multilayer ceramic package 500 is disclosed. Package 500 contains dielectric multilayer substrates 502 having transmission lines 504 deposited therebetween and at least a first of the substrates having receptacles 506 therein each complementarily configured to respectively receive a set of solder balls 508. Contacts 510 within the receptacles 506 connect transmission lines 504 to solder balls 508. Terminal pads 512 are deposited on a base substrate 514 substantially in registration and aligned with the solder balls 508 to define an electrical interconnection. A method of manufacturing a multilayer ceramic package 500 with a ball grid array is also disclosed which involves orienting package 500 so receptacles 506 face upward and flooding a major surface with solder balls 508. Subsequently, solder balls 508 that did not enter receptacles 506 are removed resulting in a low profile package with minimum height above a circuit board.

23 Claims, 10 Drawing Sheets

BALL GRID ARRAY WITH RECESSED SOLDER BALLS

FIELD OF THE INVENTION

This invention relates generally to electrical interconnections between a multilayer ceramic package and a supporting circuit board or substrate, and more particularly to a ball grid array for a multilayer ceramic package and method of manufacturing same.

BACKGROUND OF THE INVENTION

Solder bonds are commonly used to attach modules such as multilayer ceramic packages to substrates such as printed circuit boards. For microelectronic applications, one technique of connecting an electronic component to a printed circuit board involves the use of multiple solder balls in an array. This technique, commonly referred to as ball grid array (BGA) technology, subsequently places the electronic package in registration with a printed circuit board and heats the assembly until the solder balls of the array flow to effect a connection to terminals on the printed circuit board or other substrate. With a BGA-type package structure, the solder balls function as external connection terminals on a connection surface.

One problem with this technology involves the fact that as the mulilayer package sizes are decreasing in all dimensions, the traditional solder interconnections are becoming a proportionately greater contributor to overall package height above the circuit board. As a greater amount of solder may result in a mechanically stronger bond which has greater reliability, it also has the adverse effect of adding to the overall height of the multilayer ceramic package.

Another problem with this technology is that the processes and steps required to properly position the various individual solder balls at exact predetermined positions on the underside of the multilayer package may be very elaborate. Oftentimes this is mechanically achieved by techniques such as a vacuum carrier or other robotic or precise placement equipment.

Figure 1:
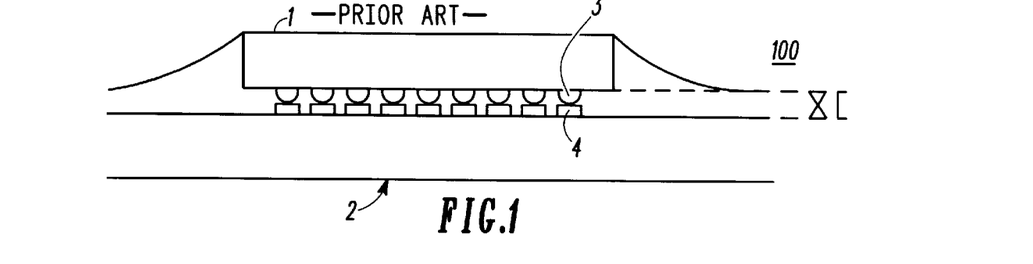
FIG. 1 shows a side view of a component mounted to a substrate with a ball grid array in accordance with the prior art.
Figure 2:
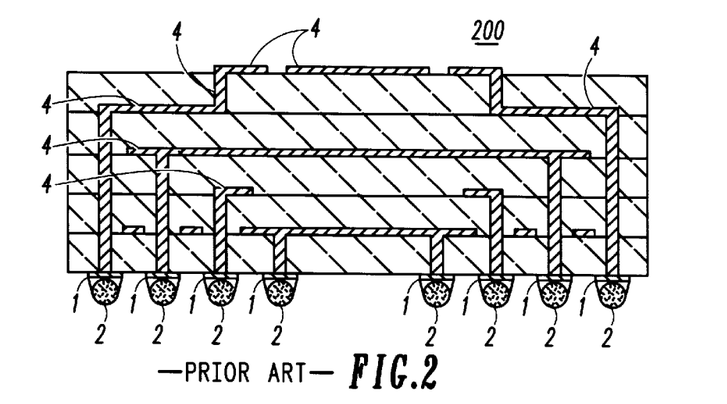
FIG. 2 shows a side view of a ceramic multilayer package with a ball grid array in accordance with the prior art.

FIG. 1 and FIG. 2 show typical methods of using ball grid arrays in accordance with the prior art. Referring to FIG. 1, a semiconductor chip assembly 100 includes a semiconductor chip 1 joined to a chip carrier 2 by solder bumps 3 mated to pads 4. It should be noted that the semiconductor chip 1 rests a certain setoff distance "X" above the chip carrier 2.

Referring next to FIG. 2, a prior art BGA multilayer package 200 is provided with a group of bump terminals 1 which have been formed by joining solder balls 2 to the bottom surface of a multilayer ceramic package. Conductive paths 4 are formed within the mulltilayer package 200 itself. Once again, the solder balls 2 add significantly to the overall height of package 200.

Figure 3:
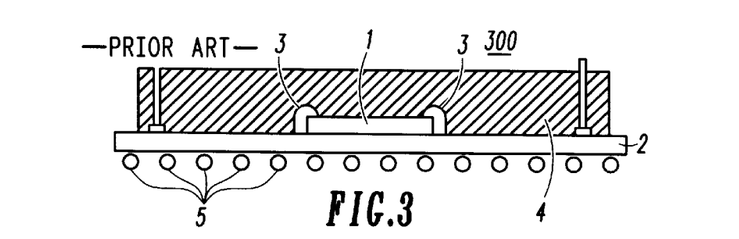
FIG. 3 shows a semiconductor component with a ball grid array in accordance with the prior art.

FIG. 3 shows another embodiment of a semiconductor package 300 with a ball grid array in accordance with the prior art. In FIG. 3, a semiconductor element 1 is attached to a base 2. The element 1 is then wire bonded to the base 2 with wires 3 and the entire assembly is encapsulated in an epoxy or resin material 4. Significantly, an array of solder balls 5 form a grid on the underside of the base and provide a means for interconnecting the semiconductor element 1 with the external circuitry.

Figure 4:
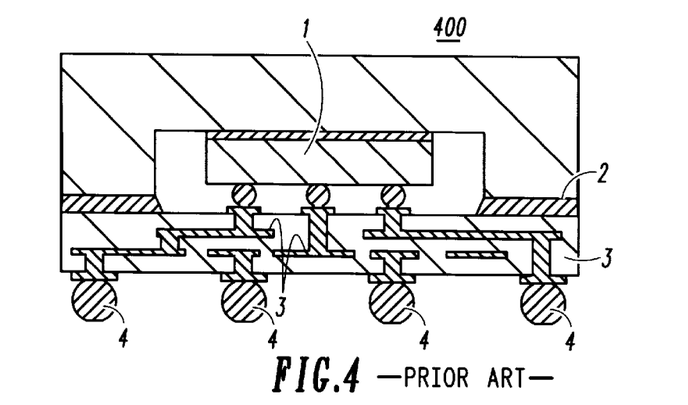
FIG. 4 shows another semiconductor component with a ball grid array in accordance with the prior art.

FIG. 4 shows still another example of a ball grid array in accordance with the prior art. In FIG. 4, a more elaborate semiconductor device 400 is provided. In this embodiment, the semiconductor element 1 rests upon a base 2 having conductive paths 3 therethrough. Solder balls 4 form a ball grid array which connect the element 1 with the external circuitry.

A mulilayer ceramic package with a ball grid array design which reduced the overall height of the ceramic package above a printed circuit board or other substrate, while simultaneously providing a high strength, reliable, interconnection of great integrity, and which is easily incorporated using conventional ceramic multilayer processing technologies and which reduced the number of processing steps and cost of equipment required to attach the multilayer ceramic package to the printed circuit board or other substrate would be considered an improvement in the art.

It will be appreciated that for simplicity and clarity of illustration, elements shown in the FIGURES have not necessarily been drawn to scale. For example, the dimensions of some elements are exaggerated relative to each other for clarity.

DETAILED DESCRIPTION OF A PREFERRED EMBODIMENT

Figure 5A:
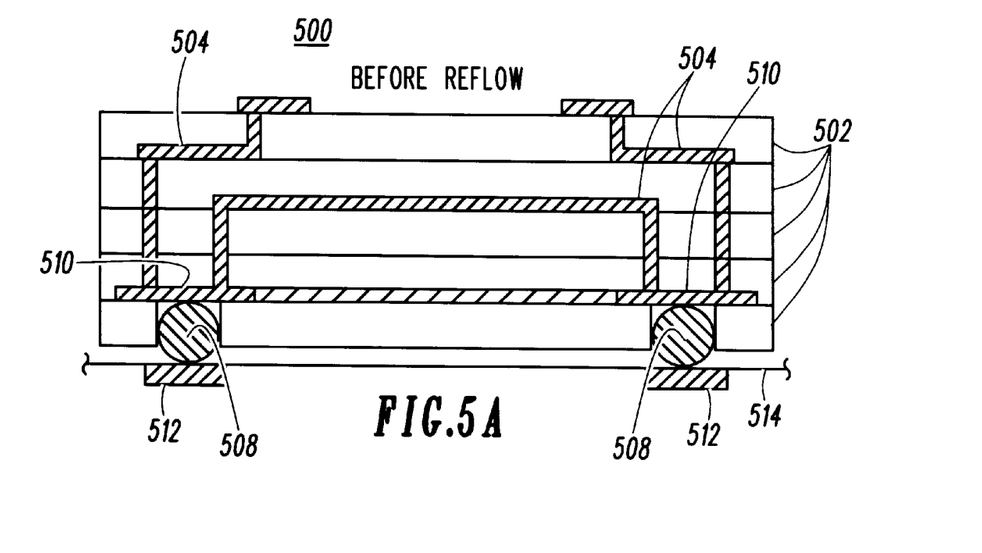
FIG. 5A shows a ball grid array for a multilayer ceramic package before reflow in accordance with one embodiment of the present invention.

In FIG. 5A, a ball grid array for a multilayer ceramic package 500 is provided. In this figure, shown before reflow, it may be seen that a solder ball rests substantially inside a receptacle in the multilayer package. Referring to FIG. 5A, package 500 contains a plurality of dielectric multilayer substrates 502 having transmission lines 504 deposited therebetween. At least a first of the plurality of dielectric substrates 502 have a plurality of receptacles 506 therein complementarily configured to receive a solder ball 508. A plurality of contacts 510, located within said receptacles 506 and recessed within said multilayer ceramic package 500, connect the transmission lines 504 to a plurality of solder balls 508.

In FIG. 5A, the plurality of solder balls 508 are located substantially within the plurality of receptacles 506 and are in direct physical contact with the plurality of contacts 510. Solder balls 508 extend at least partially outside of said receptacles 506 and are also in direct contact with a plurality of terminal pads 512. The plurality of terminal pads 512 are deposited on a base substrate 514 which is substantially in registration and aligned with the plurality of solder balls 508 to define an electrical interconnection.

Figure 5B:
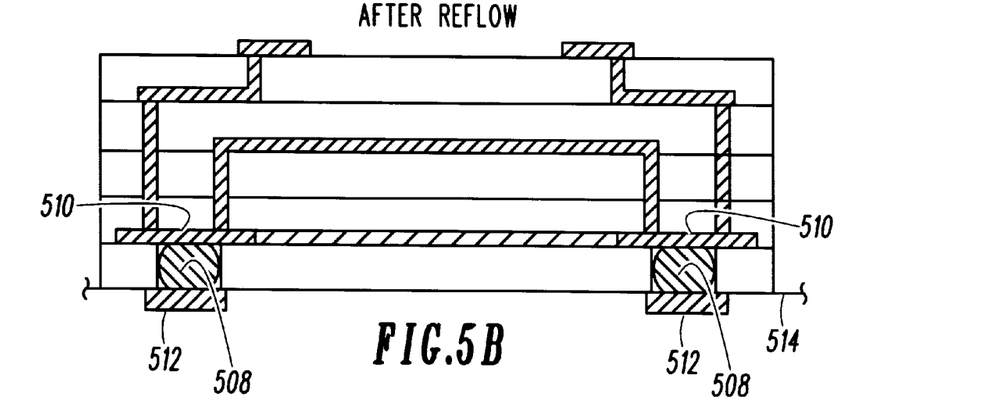
FIG. 5B shows a ball grid array for a multilayer ceramic package after reflow in accordance with one embodiment of the present invention.

Referring next to FIG. 5B, it is shown that after reflow, solder balls 508 deform to form an intimate relationship between the plurality of contacts 510, the plurality of solder balls 508 and the plurality of terminal pads 512. Moreover, it should be noted that the multilayer package 500 may actually form a direct physical contact with the base substrate 514, if such a design is required. The distance between a PCB board and the multilayer package may depend on numerous factors, including the size and shape of the well, the size and diameter of the solder ball, and by the PCB resist layer. For certain applications involving certain types of fluxes, it may be desirable to maintain a certain minimal distance between the multilayer package component and the printed circuit board, for example. In either event, regardless of the distance between the package and the board, a good mechanical solder joint is formed recessed into the multilayer package 500.

Figure 6A:
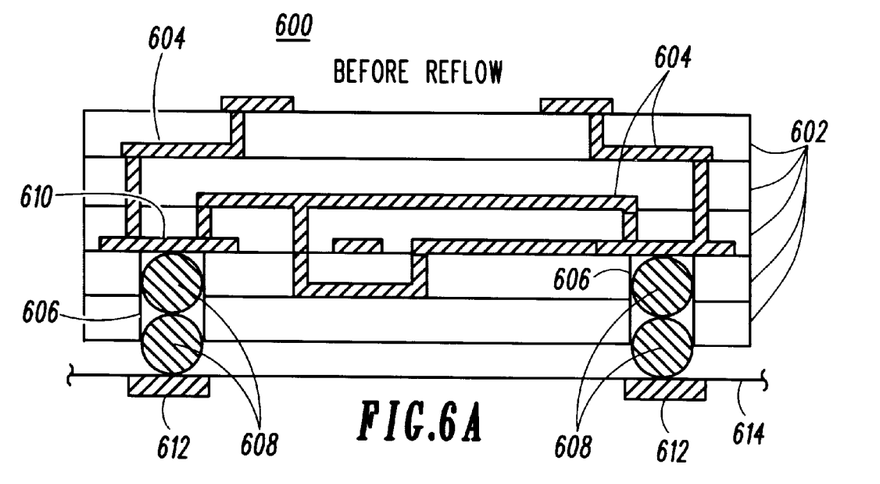
FIG. 6A shows a ball grid array for a multilayer ceramic package before reflow in accordance with another embodiment of the present invention.
Figure 6B:
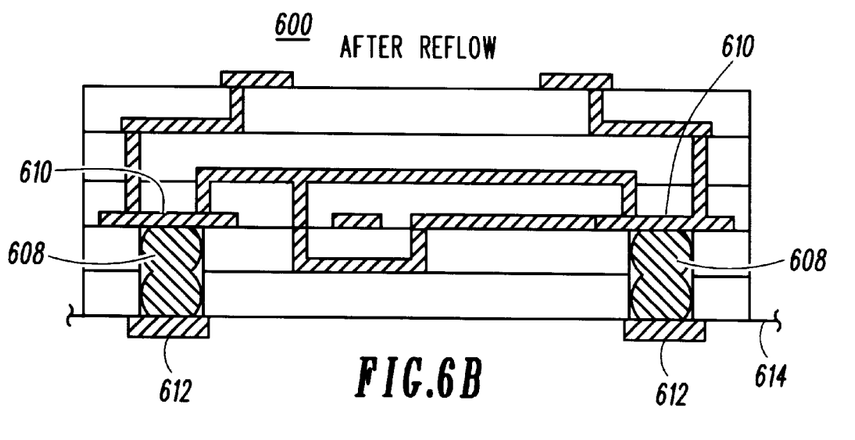
FIG. 6B shows a ball grid array for a multilayer ceramic package after reflow in accordance with another embodiment of the present invention.

Another embodiment of the present invention is shown in FIGS. 6A and 6B. Referring first to FIG. 6A, a ball grid array for a multilayer ceramic package 600 before reflow is provided having two solder balls inside each of the receptacles. This may provide a solder joint with greater mechanical integrity and may further improve the transfer of heat from the multilayer package. From FIGS. 6A and 6B, it may also be seen that the receptacles may extend through more than one of the dielectric substrates in the multilayer ceramic package 600.

Referring to FIG. 6A, package 600 contains a plurality of dielectric multilayer substrates 602 having transmission lines 604 deposited therebetween. At least a first of the plurality of dielectric multilayer substrates 602 have a plurality of receptacles 606 therein complementarily configured to receive a solder ball 608. A plurality of contacts 610, located within said receptacles 606 and recessed within said multilayer ceramic package 600, connect the transmission lines 604 to a plurality of solder balls 608.

In FIG. 6A, the plurality of solder balls 608 are located substantially within the plurality of receptacles 606 and are in direct physical contact with the plurality of contacts 610. Solder balls 608 extend at least partially outside of said receptacles 606 and are also in direct contact with a plurality of terminal pads 612. The plurality of terminal pads 612 are deposited on a base substrate 614 which is substantially in registration and aligned with the plurality of solder balls 608 to define an electrical interconnection.

Referring next to FIG. 6B, it is shown that after reflow, solder balls 608 deform to form an intimate relationship between the plurality of contacts 610, the plurality of solder balls 608 and the plurality of terminal pads 612. Moreover, it should be noted that the multilayer package 600 may actually form a direct physical contact with the base substrate 614. A good mechanical solder joint is formed recessed into the multilayer package 600. As can be clearly seen from FIGS. 6A and 6B, the BGA pads are recessed into the multilayer package, providing a greater conservation of volume in the multilayer package 600.

Figure 7A:
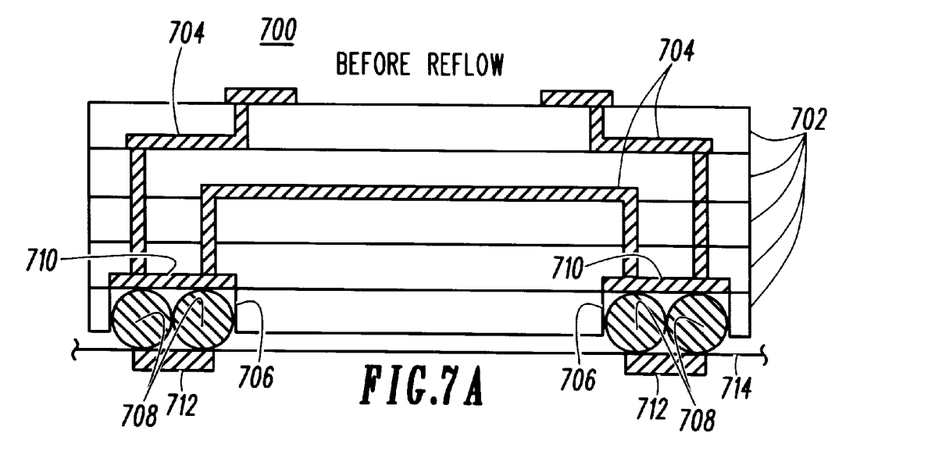
FIG. 7A shows a ball grid array for a multilayer ceramic package before reflow in accordance with another embodiment of the present invention.
Figure 7B:
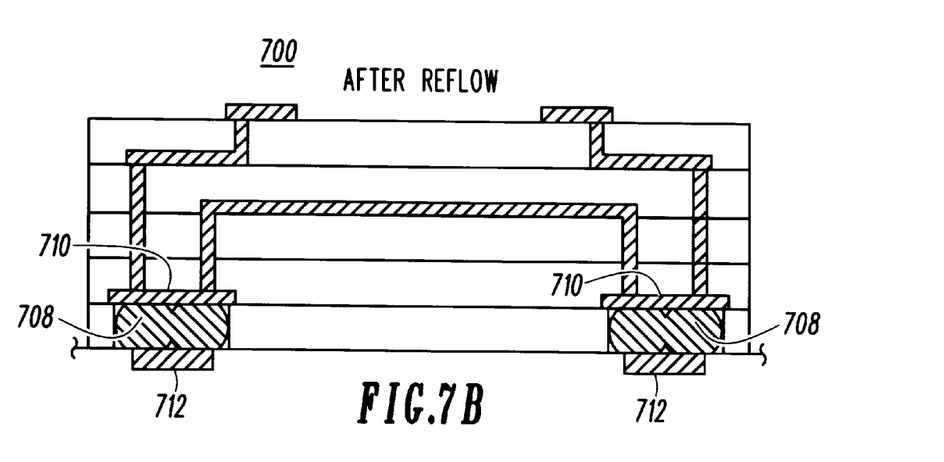
FIG. 7B shows a ball grid array for a multilayer ceramic package after reflow in accordance with another embodiment of the present invention.

Another embodiment of the present invention is shown in FIGS. 7A and 7B. Referring first to FIG. 7A, a ball grid array for a multilayer ceramic package 700 before reflow is provided having two or more solder balls inside each of the receptacles. This embodiment shows still another variation that may be designed using custom sized receptacles and solder balls.

Referring to FIG. 7A, package 700 contains a plurality of dielectric multilayer substrates 702 having transmission lines 704 deposited therebetween. At least a first of the plurality of dielectric multilayer substrates 702 have a plurality of receptacles 706 therein complementarily configured to receive a solder ball 708. A plurality of contacts 710, located within said receptacles 706 and recessed within said multilayer ceramic package 700, connect the transmission lines 704 to a plurality of solder balls 708.

In FIG. 7A, the plurality of solder balls 708 are located substantially within the plurality of receptacles 706 and are in direct physical contact with the plurality of contacts 710. Solder balls 708 extend at least partially outside of said receptacles 706 and are also in direct contact with a plurality of terminal pads 712. The plurality of terminal pads 712 are deposited on a base substrate 714 which is substantially in registration and aligned with the plurality of solder balls 708 to define an electrical interconnection.

Referring next to FIG. 7B, it is shown that after reflow, solder balls 708 deform to form an intimate relationship between the plurality of contacts 710, the plurality of solder balls 708 and the plurality of terminal pads 712. Moreover, it should be noted that the multilayer package 700 may actually form a direct physical contact with the base substrate 714. A good mechanical solder joint is formed recessed into the multilayer package 700.

Figure 8A:
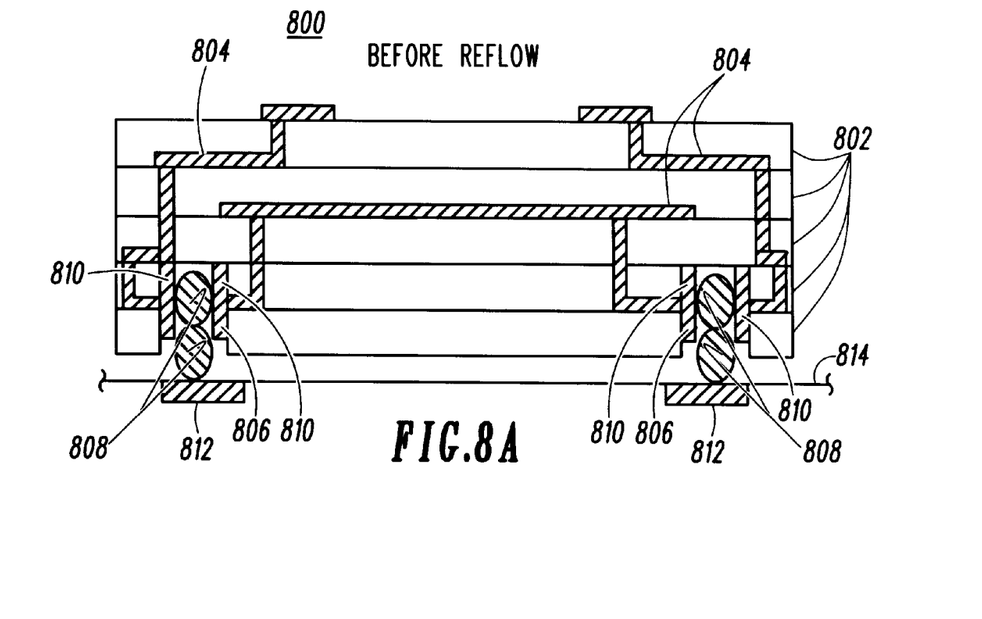
FIG. 8A shows a ball grid array for a multilayer ceramic package before reflow in accordance with another embodiment of the present invention.
Figure 8B:
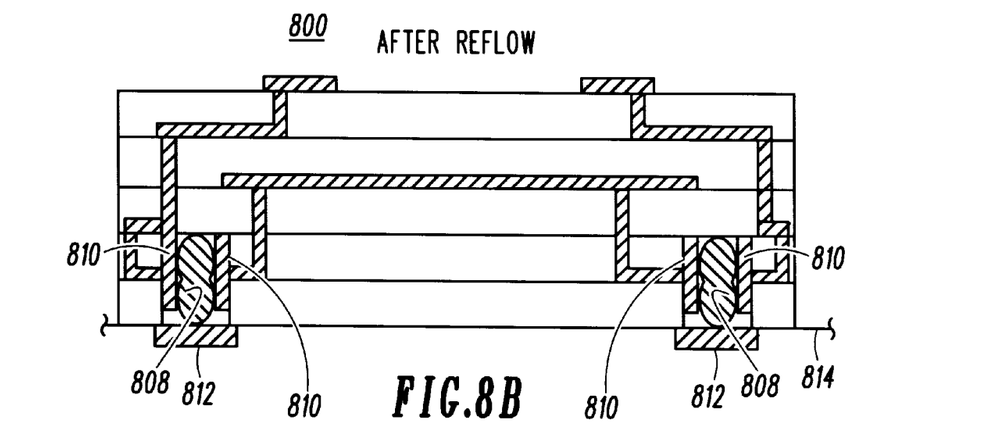
FIG. 8B shows a ball grid array for a multilayer ceramic package after reflow in accordance with another embodiment of the present invention.

Another embodiment of the present invention is shown in FIGS. 8A and 8B. Referring first to FIG. 8A, a ball grid array for a multilayer ceramic package 800 before reflow is provided having two solder balls inside each of the receptacles. This embodiment shows still another variation that may be designed using custom sized receptacles and solder balls.

Referring to FIG. 8A, package 800 contains a plurality of dielectric multilayer substrates 802 having transmission lines 804 deposited therebetween. At least a first of the plurality of dielectric multilayer substrates 802 have a plurality of receptacles 806 therein complementarily configured to receive a solder ball 808. A plurality of contacts 810, located within said receptacles 806 and recessed within said multilayer ceramic package 800, connect the transmission lines 804 to a plurality of solder balls 808.

In FIGS. 8A and 8B, contacts 810 are shown to be located on the side walls of receptacles 806. It may be desirable, for certain design applications, to connect the plurality of solder balls 808 to transmission lines 804 in this manner. Although two contacts 810 are shown in each of the receptacles 806 in FIGS. 8A and 8B, a viable electrical connection may be achieved with only a single contact 810. Both such types of side connections are contemplated to be within the scope of the present invention.

In FIG. 8A, the plurality of solder balls 808 are located substantially within the plurality of receptacles 806 and are in direct physical contact with the plurality of contacts 810. Solder balls 808 extend at least partially outside of said receptacles 806 and are also in direct contact with a plurality of terminal pads 812. The plurality of terminal pads 812 are deposited on a base substrate 814 which is substantially in registration and aligned with the plurality of solder balls 808 to define an electrical interconnection.

Referring next to FIG. 8B, it is shown that after reflow, solder balls 808 deform to form an intimate relationship between the plurality of contacts 810, the plurality of solder balls 808 and the plurality of terminal pads 812. Moreover, it should be noted that the multilayer package 800 may actually form a direct physical contact with the base substrate 814. A good mechanical solder joint is formed recessed into the multilayer package 800.

Figure 9A:
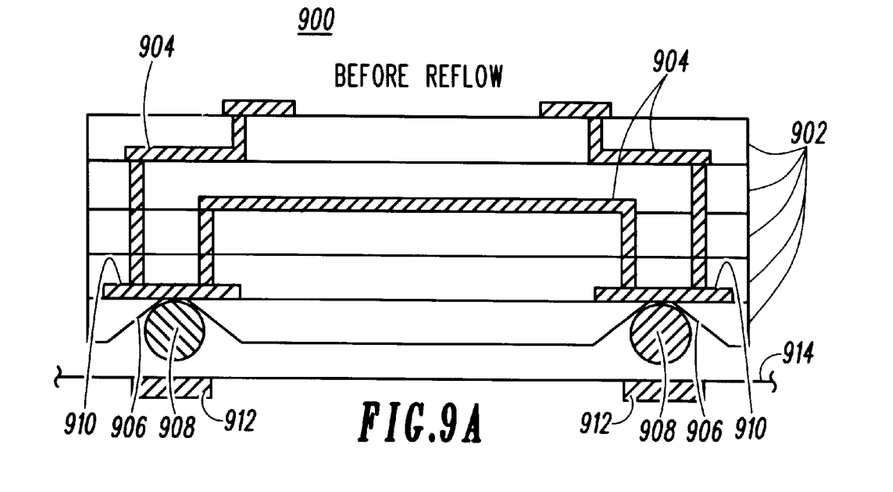
FIG. 9A shows a ball grid array for a multilayer ceramic package before reflow in accordance with another embodiment of the present invention.
Figure 9B:
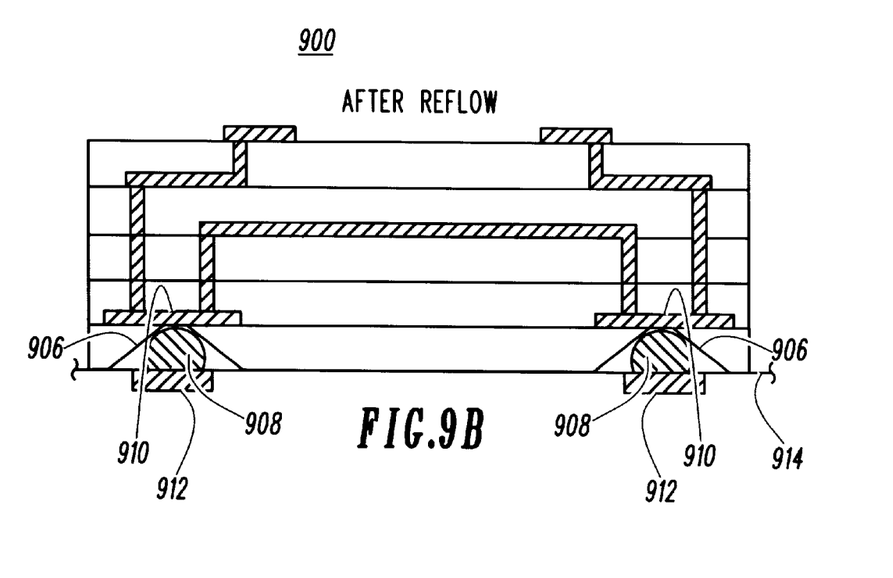
FIG. 9B shows a ball grid array for a multilayer ceramic package after reflow in accordance with another embodiment of the present invention.

Still another embodiment of the present invention is shown in FIGS. 9A and 9B. Referring first to FIG. 9A, a ball grid array for a multilayer ceramic package 900 before reflow is provided having solder balls partially recessed inside receptacles on a major surface of multilayer ceramic package 900. Referring to FIG. 9A, package 900 contains a plurality of dielectric multilayer substrates 902 having transmission lines 904 deposited therebetween. At least a first of the plurality of dielectric multilayer substrates 902 have a plurality of receptacles 906 therein complementarily configured to receive a solder ball 908.

A plurality of contacts 910, located within the receptacles 906 and recessed within said multilayer ceramic package 900, connect the transmission lines 904 to a plurality of solder balls 908. In FIG. 9A, the plurality of solder balls 908 are located substantially within the plurality of receptacles 906 and are in direct physical contact with the plurality of contacts 910. Solder balls 908 extend at least partially outside of said receptacles 906 and are also in direct contact with a plurality of terminal pads 912. The plurality of terminal pads 912 are deposited on a base substrate 914 which is substantially in registration and aligned with the plurality of solder balls 908 to define an electrical interconnection.

An important feature of FIGS. 9A and 9B is the fact that the plurality of receptacles 906 have tapered side walls. Such a design may be desirable for certain applications and may assist in placement of the solder balls 908 into the receptacles 906.

Referring next to FIG. 9B, it is shown that after reflow, solder balls 908 deform to form an intimate relationship between the plurality of contacts 910, the plurality of solder balls 908 and the plurality of terminal pads 912. Moreover, it should be noted that the multilayer package 900 may actually form a direct physical contact with the base substrate 914. A good mechanical solder joint is formed recessed into the multilayer package 900.

The multilayer ceramic package with a ball grid arrays of the present invention is intended to be used in the construction of small, high performance and cost effective components for telecommunication devices such as compact radios, cellular telephones, pagers and other electronic devices.

As such, many of the issues relating to BGA technology for semiconductors are not found in the present applications. BGA packaging arrangements were originally developed to house high speed, high pin count, digital silicon integrated circuit devices within a compact package footprint. Complicated metallization patterns, metallization schemes, and numerous layers were required to achieve the appropriate routing paths. Today, semiconductor packages employing BGA technology may require upwards of 1000 interconnects per package.

For multilayer ceramic package applications, however, an entirely different set of design rules may apply. For example, factors such as heat dissipation and internal stress relief, which are of great concern to a semiconductor BGA designer, do not play as significant a role in the design of relatively simple multilayer packages having few solder connect points with the circuit board or other substrate. Thus, multilayer ceramic packages provide a interesting application for BGA technology and are uniquely qualified to accomodate variations, such as a recessed BGA design, which are not contemplated by traditional BGA designers.

Multilayer ceramic packages also may serve as ideal carriers for other sub-assemblies or modules. In one embodiment of the present invention, the multilayer ceramic package may support other electronic components, such as integrated circuits (IC's) or surface acoustic wave (SAW) filters, positioned within or on top of the multilayer package. Such a multi-chip module is contemplated to be within the scope of the instant invention.

Figure 10:
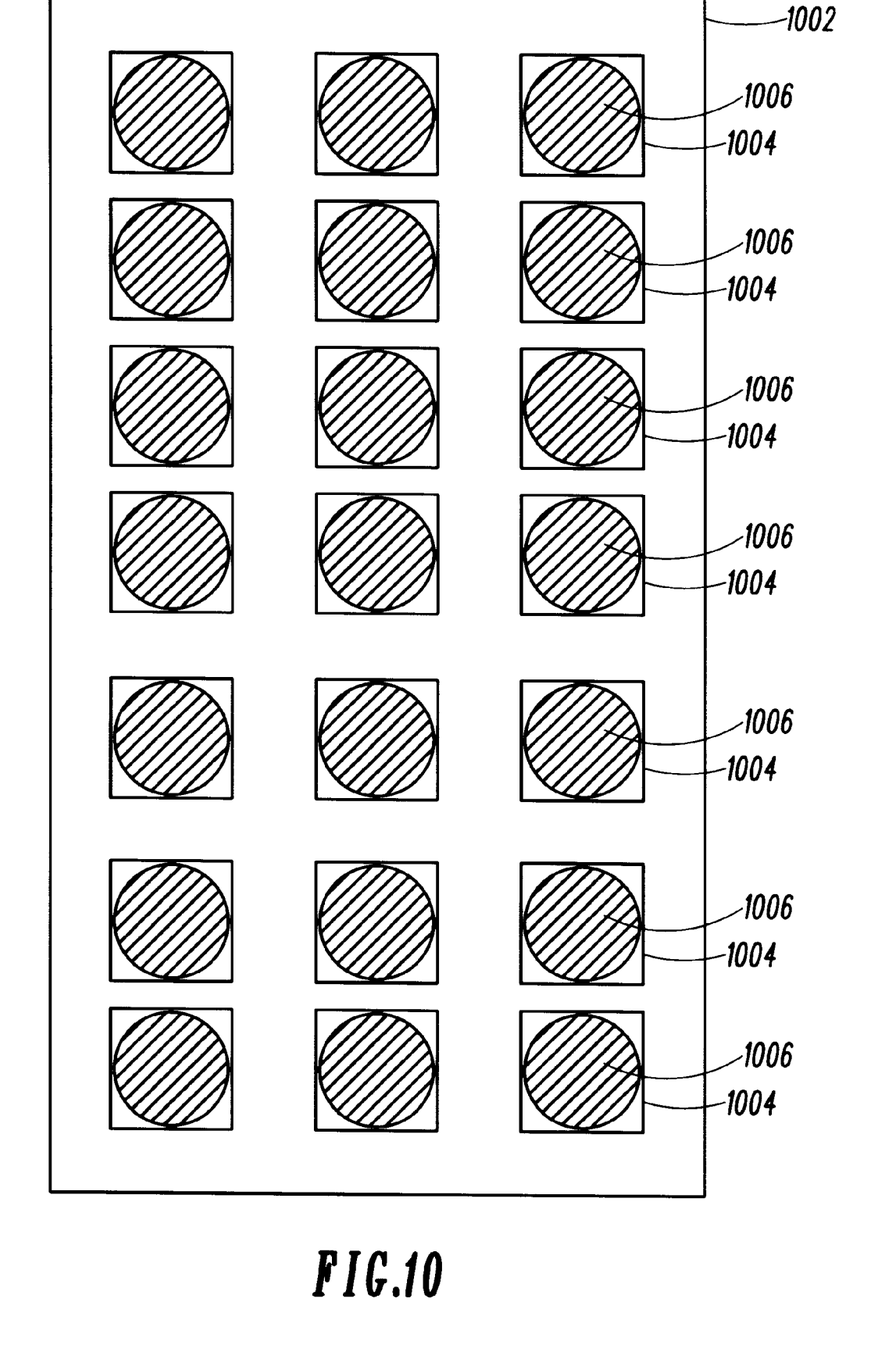
FIG. 10 shows a plan view of a footprint for a multilayer ceramic package with a ball grid array in accordance with one embodiment of the present invention.

In a preferred embodiment, the multilayer ceramic package will be mechanically and electrically attached to the printed circuit board using a ball grid array configuration which comprises a rectangular grid of rows and columns separated by a predetermined distance (see FIG. 10). In other embodiments of the present invention, it may only require a relatively few number of electrical interconnections to adequately attach the multilayer ceramic package to the substrate or printed circuit board. For example, electrical input and output connections as well as electrical ground connections may be all that are required for certain multilayer package applications.

Figure 11:
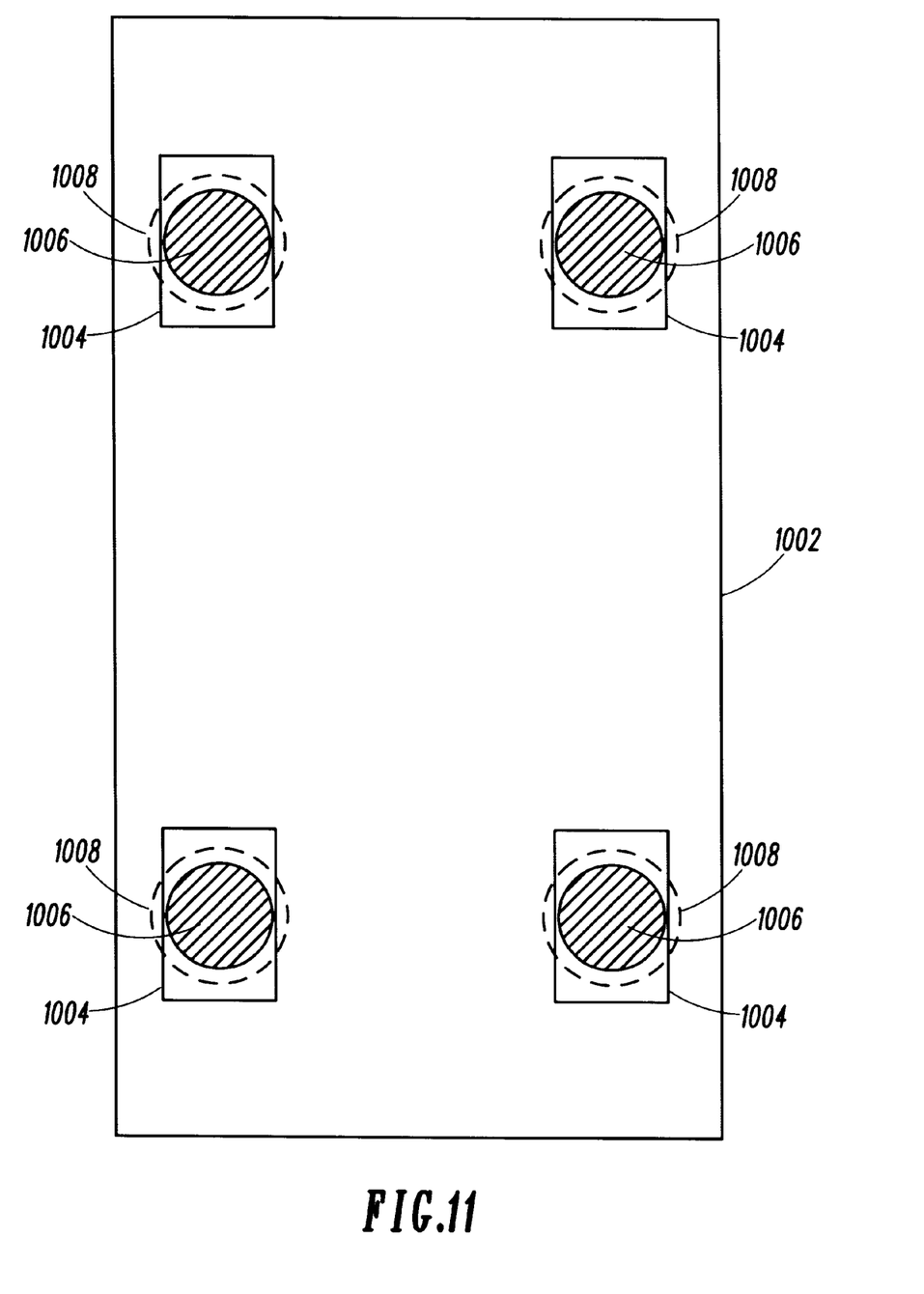
FIG. 11 shows a plan view of a footprint for a multilayer ceramic package with a ball grid array in accordance with another embodiment of the present invention.
Figure 12:
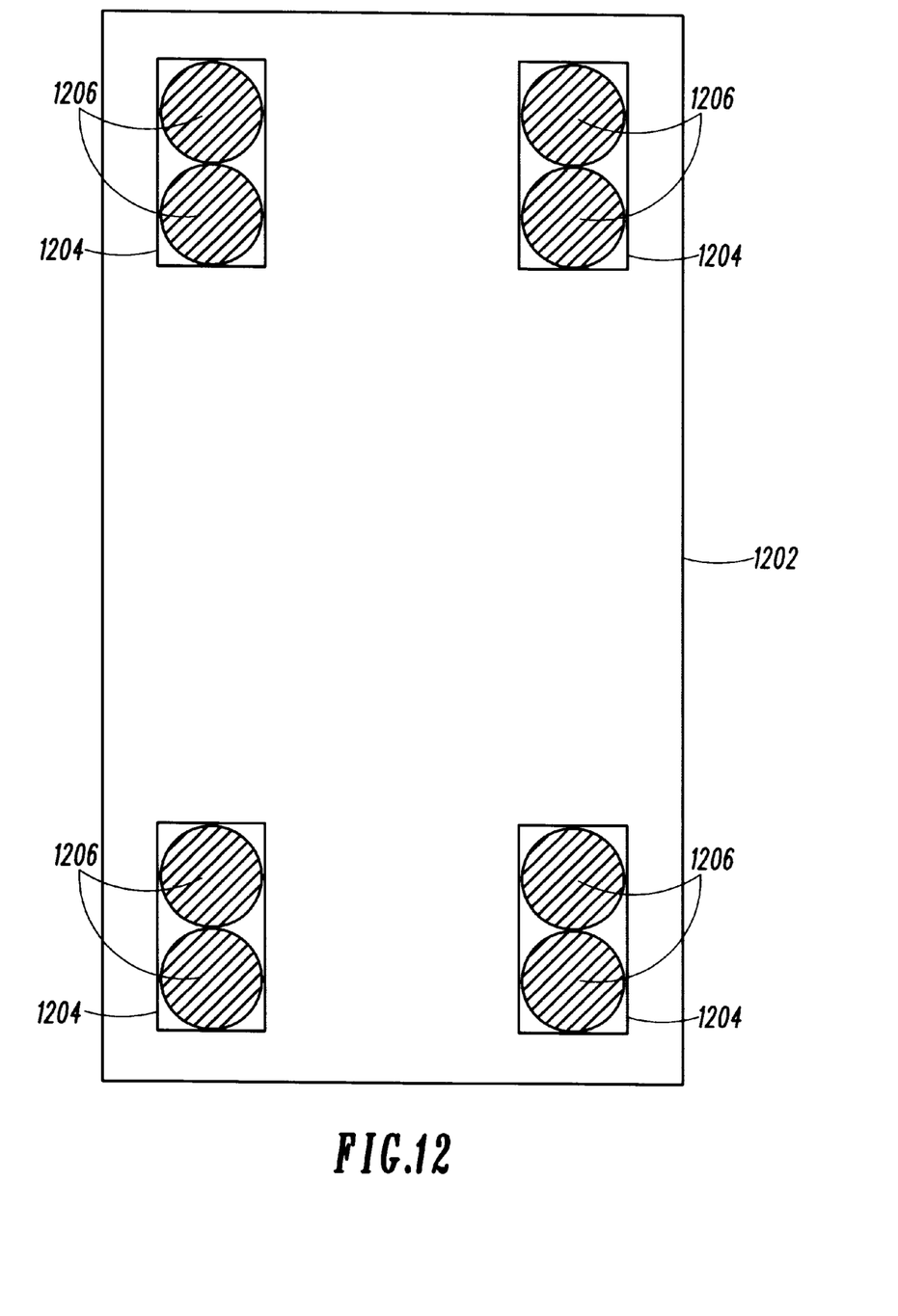
FIG. 12 shows a plan view of a footprint for a multilayer ceramic package with a ball grid array in accordance with another embodiment of the present invention.

Various receptacle configurations are provided in FIGS. 10 through 12 and each may be used in conjunction with a multilayer package such as the ones shown in FIGS. 5 through 9. Referring first to FIG. 10, a plan view of a footprint for a multilayer ceramic package with a ball grid array in accordance with one embodiment of the present invention is provided. In FIG. 10, a multilayer substrate 1002 is provided. Substrate 1002 has a plurality of receptacles 1004 which are each complementarily configured to receive a solder ball 1006 therein. In FIG. 10, it should be noted that the receptacles are placed in an array configuration having rows and columns extending across substantially the entire surface of the substrate.

FIG. 11 shows another embodiment of a receptacle layout for the present invention. FIG. 11 shows a plan view of a footprint for a multilayer ceramic package with a ball grid array. A substrate 1102 is provided which has a plurality of receptacles 1104 which are each complementarily configured to receive a solder ball 1106 therein. In another embodiment, the receptacles may be circular in shape (see dashed lines 1108) and also may be complementarily configured to receive a solder ball 1106 therein. Moreover, for certain electronic components, it may be possible to attach the multilayer ceramic package to a substrate or printed circuit board using only a few solder balls. In one preferred embodiment, such a multilayer ceramic package component may have the solder balls aligned around a periphery of the substrate.

FIG. 12 shows still another embodiment of a receptacle layout for the present invention. FIG. 12 shows a plan view of a footprint for a multilayer ceramic package with a ball grid array. A substrate 1202 is provided which has a plurality of receptacles 1204 which are each complementarily configured to receive two or more solder balls 1206 therein. Of course, for each application, a custom footprint may be incorporated depending upon the specific nature of the component and the corresponding circuit board layout.

The solder balls used in conjunction with the present invention may be, for example, formed from a lead-tin alloy having about a 60:40 lead-tin composition. For certain applications, it may be desirable to use a higher melting solder such as a 90:10 lead-tin composition. Other variations including highly conductive materials such as silver, palladium, tungsten, gold, copper, may also be employed. A preferred embodiment will employ standard solder balls used in the industry. Similarly, industry standard metallization materials may be used, in a preferred embodiment, to create the transmission lines internal to the multilayer ceramic package.

Package designers have been known to go to great lengths in order to control the distance that the component is placed above the substrate. One control means involves mechanical standoff elements, such as pins, between the component and the substrate. A mechanical standoff may elevate a component a desired height above the substrate when the solder is molten, for forming solder joints of controlled shape, height and breadth.

The standoff, also known as the height of the multilayer package above the substrate or other printed circuit board after reflow is an important design parameter. With the present invention, the dimensions of the receptacles may be used to determine an appropriate setoff distance for each individual design. In a preferred embodiment, the standoff distance will be minimized in order to reduce the height or "z-dimension" of the multilayer ceramic package above the printed circuit board. Designers must also prevent the solder ball height after reflow from becoming too great. If the solder ball has a post reflow shape which encourages internal stresses, a weakened solder joint may result. The present invention contemplates a recessed BGA arrangement which maintains strong yet buried solder joints.

With the multilayer package of the present design, maintaining solder joints with good mechanical strength and integrity is still important, however, this is cleverly achieved using the multilayer package itself and not requiring additional height to achieve the necessary standoff.

The ceramic multilayer package of the present invention may contain extensive and elaborate metallization layers therein resulting in conductive paths which serve to connect the various components of the package. In FIGS. 5–9, a rather simplified metallization scheme is provided. It will be understood by those skilled in the art that complex electrical paths may be created in the multilayer package having complicated terminal connections as well as complicated metallization patterns between and through the various layers of the ceramic multilayer package to facilitate numerous different applications.

The instant invention also contemplates a novel method of manufacturing a multilayer ceramic package using BGA technology. Such a process may be used in conjunction with many of the traditional multilayer ceramic processing technologies used in industry today. A flow chart of the method of manufacturing a multilayer ceramic package with a BGA is provided in FIG. 13.

Figure 13:
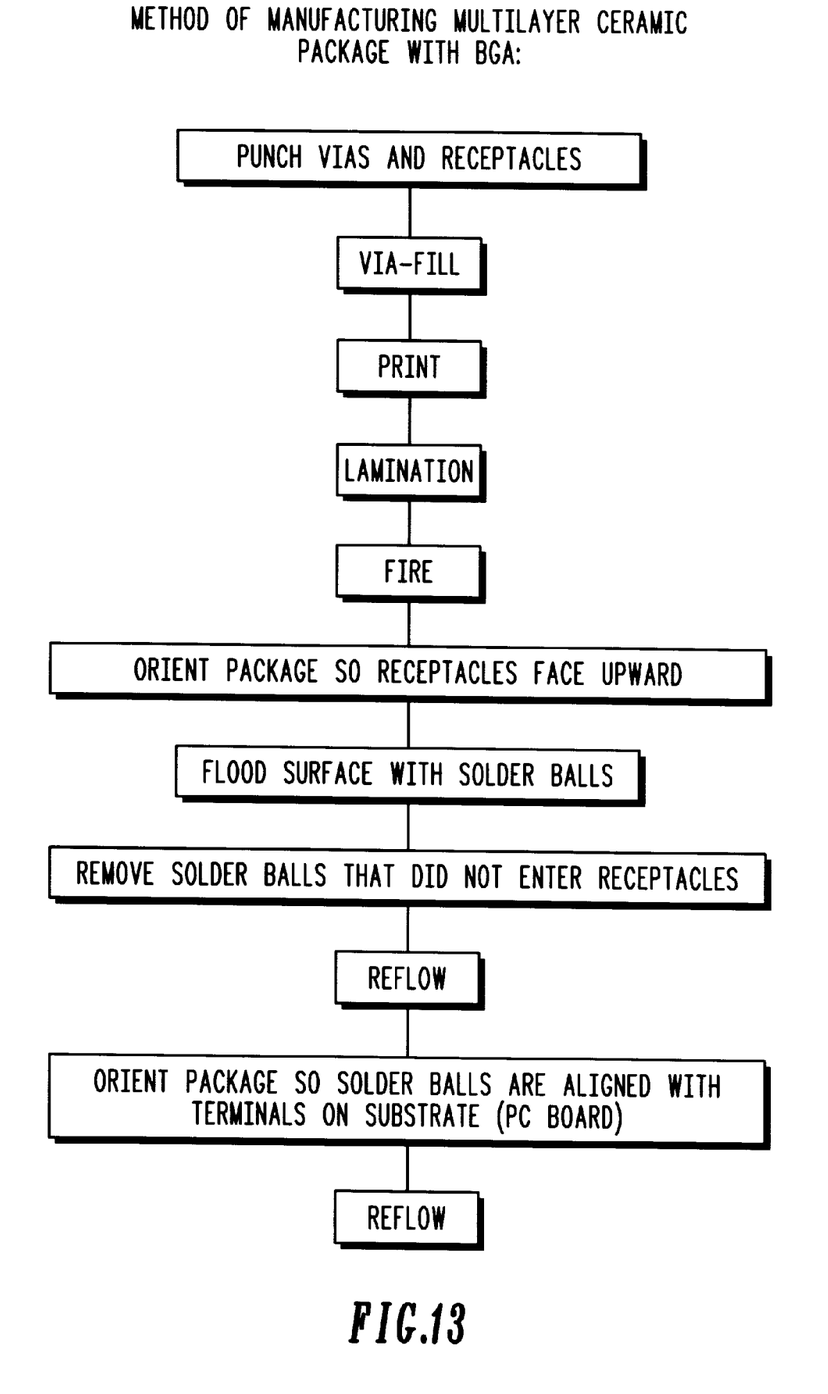
FIG. 13 shows a flowchart describing a method of manufacturing a multilayer ceramic package with a ball grid array in accordance with the present invention.

The method of attaching a multilayer ceramic package to a substrate using a ball grid array, comprising the steps of first punching vias and receptacles into a green ceramic tape material. Since via punching is well known, this may be one easy method of creating receptacles on one surface of the multilayer package. Other techniques, such as pressing cavities to the green tape may also be employed.

The next step of the process may involve via-filling the vias with a conductive material. This step of the process is also well known in the industry. Then, it may be necessary to print transmission lines on the green ceramic tape material. Subsequently, it may be necessary to laminate the green ceramic tape material into a laminated package having receptacles on a major surface. The next step of the process may include firing the laminated package to form a dense structure. It will be understood by those skilled in the art that the exact process steps to achieve the fired package may be varied depending upon the specific application.

The next step of the process addresses the fact that solder ball placement is oftentimes an elaborate process in BGA technology. Whereas prior BGA methods employed complex fixturing equipment to hold each individual solder ball in place, the present invention envisions orienting the package so that the cavities (receptacles) face upward and then flooding the major surface with solder balls so that the receptacles become filled with solder balls. In effect, the package serves as its own assembly tool for ball attach, eliminating the need for expensive and elaborate fixturing equipment.

It is then necessary to remove the solder balls that did not enter the receptacles and connect to the transmission lines. The next step of the process involves reflowing the package so that the solder balls connect to the transmission lines. This step guarantees that the solder balls will remain in the receptacles by effectively wetting them to contact points buried inside the receptacles of the multilayer package. The next step involves orienting the package so that solder balls are aligned with a plurality of terminals on a substrate; and the final step involves reflowing to connect the solder balls to the terminals on the substrate.

The process described above, which involves showering a major surface of the multilayer ceramic package to create the ball grid array, is open to many design variables. Certainly the dimensions of the receptacles may effect the positioning of the solder balls. A designer may adjust solder ball size and diameter in conjunction with the dimensions of the receptacles to control geometry, height above board, mechanical attachment, and other interconnect parameters.

In one preferred embodiment, the receptacles may have no sharp corners or angles in order to prevent stress concentrations. In this instance, the receptacles will be circular in shape and have a diameter which is slightly smaller than the solder ball diameter. Accordingly, the solder balls will rest inside the receptacles, but will also have an area of the solder ball outside of the receptacles. Such a design allows the solder to reflow effectively into the receptacle forming a solder joint which is mechanically strong and stress free.

Thermal issues, which tend to greatly effect BGA packages in the semiconductor arena, are not as significant in multilayer ceramic packages. In fact, for a multilayer ceramic package, the thermal paths may be designed to be quite large and robust. Many ceramic multilayer packages may be designed with only a relatively few terminal and contact pads which effectively remove any excess heat from the multilayer package.

In a preferred embodiment, the present invention may be used with non-cleaning fluxing agents. This becomes necessary because as the package reflows to come into direct contact with the substrate or printed circuit board, there will be no further post reflow cleaning operations.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A multilayer ceramic package, comprising:
   a plurality of dielectric substrates having transmission lines deposited therebetween;
   at least a first of said plurality of dielectric substrates having a plurality of receptacles therein each complementarily configured to respectively receive at least on solder ball, the solder ball not completely filling the respective one of said receptacles;
   a plurality of contacts, one each located within each of said receptacles and recessed within said multilayer ceramic package for connecting at least one of said transmission lines to said at least one solder ball;
   said at least one solder ball having a majority of its mass within the respective one of the plurality of receptacles in direct electrical contact with the respective one of said contacts and extending at least partially outside of said respective one of said receptacles; and
   a plurality of terminal pads deposited on a base substrate and in registration and aligned with said solder balls to define an electrical interconnection.

2. The multilayer ceramic package of claim 1, wherein said at least one solder ball provide a solder joint substantially recessed inside the multilayer ceramic package.

3. The multilayer ceramic package of claim 1, wherein the receptacles are provided by punching a hole having a lesser diameter than said at least one solder ball into said first of said plurality of dielectric multilayer substrates.

4. The multilayer ceramic package of claim 1, wherein the receptacles are provided by punching a hole having a greater diameter than said at least one solder ball into said first of said plurality of dielectric multilayer substrates.

5. The multilayer ceramic package of claim 1, wherein each of said plurlity of receptacles contains at least two solder balls.

6. The multilayer ceramic package of claim 1, wherein said plurality of receptacles have tapered side walls.

7. The multilayer ceramic package of claim 1, wherein said at least one solder ball comprise an alloy of from about 70% to about 95% lead and from about 30% to about 5% tin.

8. The multilayer ceramic package of claim 1, wherein said at least one solder balls comprise a non-lead solder.

9. The multilayer ceramic package of claim 1, wherein said plurality of receptacles are substantially cylindrical.

10. The multilayer ceramic package of claim 1, wherein said plurality of receptacles are substantially dome-shaped.

11. The multilayer ceramic package of claim 1, further comprising integrated circuit package attached thereto defining a multilayer ceramic package module.

12. The multilayer ceramic package of claim 1, wherein said plurality of receptacles are disposed only around the periphery of the first of said plurality of dielectric multilayer substrates.

13. The multilayer ceramic package of claim 1, wherein the receptacles are disposed in an array configuration on the first of said plurality of dielectric multilayer substrates.

14. The multilayer ceramic package of claim 1, wherein said at least one solder ball is capable of melting with the application of heat to bring the first of the plurality of dielectric multilayer substrates into direct physical contact with the base substrate.

15. The multilayer ceramic package of claim 1, wherein said at least one solder ball and said plurality of receptacles are capable of removing heat from the multilayer ceramic package.

16. The multilayer ceramic package of claim 1, wherein said at least one solder ball includes a non-cleaning fluxing agent.

17. A multilayer ceramic package, comprising:
    a plurality of dielectric multilayer substrates having transmission lines deposited therebetween;
    at least a first of said plurality of dielectric multilayer substrates having a plurality of receptacles therein each complementarily configured to respectively receive at least one solder ball, said plurality of receptacles each having a first diameter;
    said at least one solder ball having substantially all of its mass within the respective one of the plurality of receptacles, but not completely filling the respective receptacle, and in direct electrical contact with at least one of said transmission lines; and
    a plurality of terminal pads deposited on a base substrate and in registration and aligned with said solder balls to define an electrical interconnection, said base substrate being contiguous to said first of said plurality of dielectric multilayer substrates.

18. The multilayer ceramic package of claim 17, wherein said at least one solder ball provide a solder joint substantially recessed inside the multilayer ceramic package.

19. The multilayer ceramic package of claim 17, wherein said at least one solder ball comprise an alloy of from about 70% to about 95% lead and from about 30% to about 5% tin.

20. The multilayer ceramic package of claim 17, wherein said at least one solder ball are reflowed in the presence of a non-cleaning fluxing agent.

21. The multilayer ceramic package of claim 17, further comprising integrated circuit packages attached thereto defining a multilayer ceramic package module.

22. The multilayer ceramic package of claim 17, wherein the plurality of circular receptacles and at least one solder ball provide a mechanical bond between the multilayer ceramic package and the base substrate.

23. The multilayer ceramic package of claim 17, wherein said base substrate is capable of being in contact with said first of said plurality of dielectric substrates.

* * * * *